(12) United States Patent
Yagi et al.

(10) Patent No.: US 11,676,796 B2
(45) Date of Patent: Jun. 13, 2023

(54) CHARGED PARTICLE BEAM DEVICE

(71) Applicant: JEOL Ltd., Tokyo (JP)

(72) Inventors: Kazuki Yagi, Tokyo (JP); Yu Jimbo, Tokyo (JP); Bryan W. Reed, San Leandro, CA (US); Ruth Shewmon Bloom, Oakland, CA (US)

(73) Assignee: JEOL Ltd., Tokyo (JP)

( * ) Notice: Subject to any disclaimer, the term of this patent is extended or adjusted under 35 U.S.C. 154(b) by 0 days.

(21) Appl. No.: 17/472,816

(22) Filed: Sep. 13, 2021

(65) Prior Publication Data

US 2022/0084783 A1    Mar. 17, 2022

(30) Foreign Application Priority Data

Sep. 17, 2020   (JP) .............................. JP2020-156305

(51) Int. Cl.
*H01J 37/28* (2006.01)
*H01J 37/04* (2006.01)
(Continued)

(52) U.S. Cl.
CPC ............ *H01J 37/28* (2013.01); *H01J 37/045* (2013.01); *H01J 37/1477* (2013.01); *H01J 37/244* (2013.01); *H01J 2237/24415* (2013.01)

(58) Field of Classification Search
CPC .. H01J 37/00; H01J 37/02; H01J 37/26; H01J 37/28; H01J 37/045; H01J 37/1477; H01J 37/244; H01J 37/265; H01J 37/268; H01J 2237/24415; H01J 2237/24455; H01J 2237/2802
(Continued)

(56) References Cited

U.S. PATENT DOCUMENTS

| | | | |
|---|---|---|---|
| 6,548,811 B1 * | 4/2003 | Nakamura ............ | H01J 37/295 250/311 |
| 2002/0109090 A1 * | 8/2002 | Nakasuji ............... | H01J 37/073 250/311 |

(Continued)

FOREIGN PATENT DOCUMENTS

| JP | 2007113992 A | 5/2007 |
|---|---|---|
| JP | 2011123999 A | 6/2011 |

(Continued)

OTHER PUBLICATIONS

Extended European Search Report issued in EP21197177.5 dated Mar. 17, 2022.
Office Action issued in JP2020-156305 dated Oct. 11, 2022.

*Primary Examiner* — Jason L McCormack
(74) *Attorney, Agent, or Firm* — The Webb Law Firm

(57) ABSTRACT

A charged particle beam device including: a charged particle beam source which emits a charged particle beam; a blanking device which has an electrostatic deflector that deflects and blocks the charged particle beam; an irradiation optical system which irradiates a specimen with the charged particle beam; and a control unit which controls the electrostatic deflector, the control unit performing processing of: acquiring a target value of a dose of the charged particle beam for the specimen; setting a ratio A/B of a time A during which the charged particle beam is not blocked to a unit time B (where A≠B, A≠0), based on the target value; and operating the electrostatic deflector based on the ratio.

8 Claims, 15 Drawing Sheets

(51) Int. Cl.
*H01J 37/147* (2006.01)
*H01J 37/244* (2006.01)

(58) Field of Classification Search
USPC .......................................... 250/306, 307, 311
See application file for complete search history.

(56) References Cited

U.S. PATENT DOCUMENTS

| | | | |
|---|---|---|---|
| 2003/0116717 A1* | 6/2003 | Knippelmeyer | H01J 37/244 |
| | | | 250/397 |
| 2012/0241611 A1* | 9/2012 | Kaji | H01J 37/244 |
| | | | 250/311 |
| 2016/0013012 A1 | 1/2016 | Sasaki | |
| 2017/0323763 A1 | 11/2017 | Itai et al. | |
| 2019/0080877 A1* | 3/2019 | Nakayama | H01J 37/10 |
| 2019/0228945 A1 | 7/2019 | Sawada | |
| 2021/0020422 A1* | 1/2021 | Nakamura | H01J 3/26 |

FOREIGN PATENT DOCUMENTS

| | | | |
|---|---|---|---|
| JP | 2019129073 A | 8/2019 | |
| WO | 2017221362 A1 | 12/2017 | |

\* cited by examiner

Frequency:1KHz:1msec
Duty 50%: 0.5msec illumination

Frequency:10KHz:0.1msec
Duty 50%: 50 μ sec illumination

Frequency:100KHz:10 μ sec
Duty 50%: 5 μ sec illumination

CHARGED PARTICLE BEAM DEVICE

CROSS-REFERENCE TO RELATED APPLICATION

This application claims priority to Japanese Patent Application No. 2020-156305 filed Sep. 17, 2020, the disclosure of which is hereby incorporated by reference in its entirety.

BACKGROUND OF THE INVENTION

Field of the Invention

The present invention relates to a charged particle beam device.

Description of Related Art

Charged particle beam devices such as a transmission electron microscope, a scanning transmission electron microscope, a scanning electron microscope, and a focused ion-beam device are provided with an irradiation optical system for irradiating a specimen with an electron beam, an ion beam, or the like. The irradiation optical system includes a condenser lens, an aperture, and an aberration corrector such as a Cs corrector.

For example, JP-A-2019-129073 discloses an electron microscope provided with an irradiation optical system that includes an aberration corrector for correcting spherical aberration and chromatic aberration.

A charged particle beam device such as that described above enables a dose of an electron beam to be adjusted. For example, an electron microscope such as a scanning transmission electron microscope enables a dose of an electron beam to be adjusted by changing excitation of a condenser lens to change a spot size. In addition, a dose of an electron beam can be adjusted by resizing an aperture of an irradiation optical system.

However, a change in the excitation of the condenser lens necessitates axis alignment and an adjustment of an aberration corrector. In addition, resizing of the aperture necessitates an adjustment of the aperture. Furthermore, resizing of the aperture causes a convergence angle of the electron beam to change. In this manner, when a dose of an electron beam is changed, conditions of an optical system may change and require the optical system to be readjusted.

SUMMARY OF THE INVENTION

According to an aspect of the invention, there is provided a charged particle beam device including:

a charged particle beam source which emits a charged particle beam;

a blanking device which has an electrostatic deflector that deflects and blocks the charged particle beam;

an irradiation optical system which irradiates a specimen with the charged particle beam; and a control unit which controls the electrostatic deflector, the control unit performing processing of:

acquiring a target value of a dose of the charged particle beam for the specimen;

setting a ratio A/B of a time A during which the charged particle beam is not blocked to a unit time B (where A≠B, A≠0), based on the target value; and operating the electrostatic deflector based on the ratio.

DESCRIPTION OF THE INVENTION

According to an embodiment of the invention, there is provided a charged particle beam device including:

a charged particle beam source which emits a charged particle beam;

a blanking device which has an electrostatic deflector that deflects and blocks the charged particle beam;

an irradiation optical system which irradiates a specimen with the charged particle beam; and a control unit which controls the electrostatic deflector, the control unit performing processing of:

acquiring a target value of a dose of the charged particle beam for the specimen;

setting a ratio A/B of a time A during which the charged particle beam is not blocked to a unit time B (where A≠B, A≠0), based on the target value; and operating the electrostatic deflector based on the ratio.

In such a charged particle beam device, a dose of a charged particle beam can be controlled with a blanking device. Therefore, in such a charged particle beam device, the dose of the charged particle beam can be changed without changing conditions of an optical system.

Hereinafter, preferred embodiments of the invention will be described in detail with reference to the drawings. It is to be understood that the embodiments described below are not intended to unduly limit contents of the invention as set forth in the claims. It is also to be understood that all of the components described below are not necessarily essential requirements of the invention.

Furthermore, while the charged particle beam device according to the invention will be described below using an electron microscope that performs an observation of a specimen by irradiating the specimen with an electron beam as an example, the charged particle beam device according to the invention may be an apparatus that performs an observation of a specimen by irradiating the specimen with a charged particle beam (such as an ion beam) other than an electron beam.

1. First Embodiment 1.1. Electron Microscope

Figure 1:
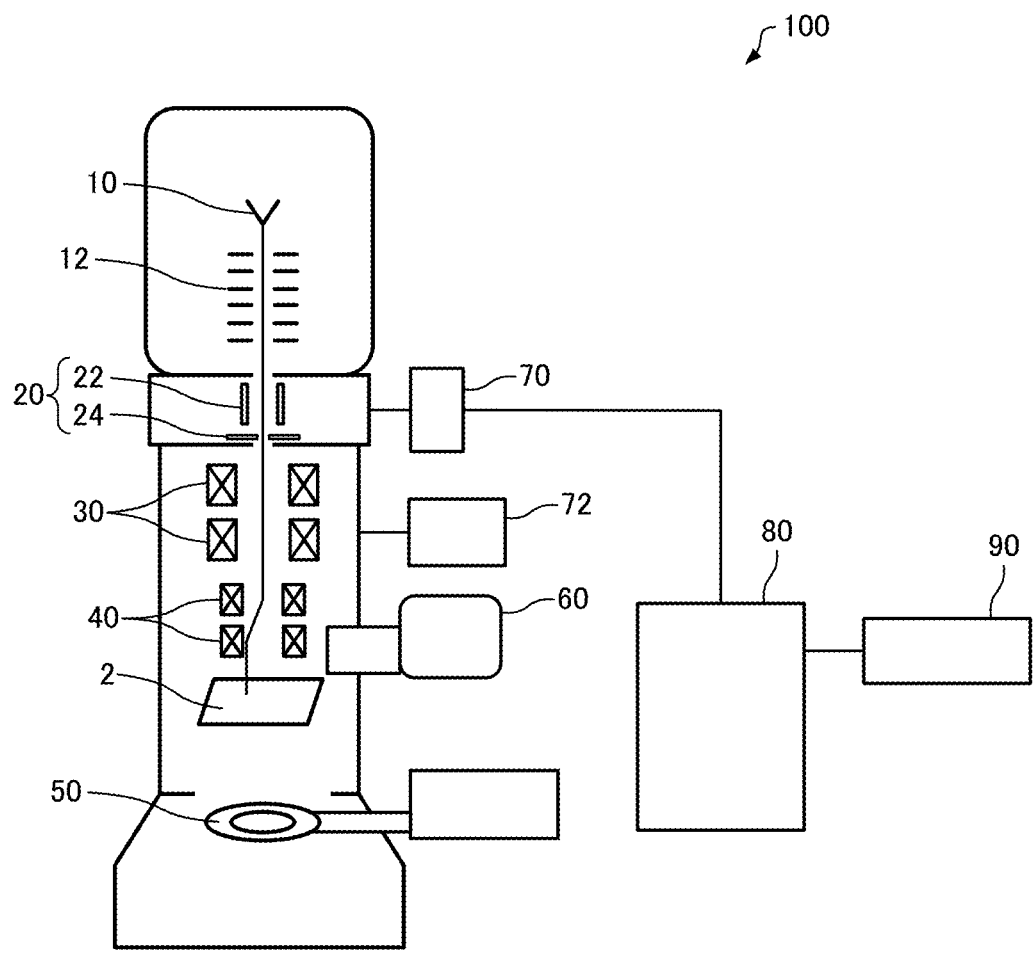
FIG. 1 is a diagram illustrating a configuration of an electron microscope according to the first embodiment.

First, an electron microscope according to the first embodiment will be described with reference to the drawings. FIG. 1 is a diagram illustrating a configuration of an electron microscope 100 according to the first embodiment.

The electron microscope 100 is a scanning transmission electron microscope (STEM) for scanning a specimen 2 with an electron beam (an example of a charged particle beam) and detecting electrons having been transmitted through the specimen 2 to obtain a scanned image.

A scanned image is an image obtained by scanning with a charged particle beam such as an electron beam or an ion beam. Scanned images include bright-field STEM images, dark-field STEM images including HAADF images, EDS maps using an energy-dispersive X-ray spectrometer (EDS), and EELS maps using an electron energy-loss spectrometer (EELS).

As illustrated in FIG. 1, the electron microscope 100 includes an electron source 10 (an example of a charged particle beam source), a blanking device 20, an irradiation optical system 30, a scanning deflector 40, an electron detector 50 (an example of a charged particle detector), an X-ray detector 60, a blanking drive circuit 70, a scanning signal generator 72, a control unit 80, and an input unit 90.

The electron source 10 emits an electron beam. The electron source 10 is, for example, an electron gun which accelerates electrons emitted from a cathode by an anode and which emits an electron beam. The electron beam emitted from the electron source 10 is accelerated by an acceleration tube 12.

The blanking device 20 is arranged between the electron source 10 and the irradiation optical system 30. The blanking device 20 controls on and off of the electron beam that irradiates the specimen 2. In other words, the blanking device 20 switches between a state (on) where the electron beam irradiates the specimen 2 and a state (off) where the electron beam does not irradiate the specimen 2.

The blanking device 20 includes an electrostatic deflector 22 and an aperture 24. The electrostatic deflector 22 generates an electrostatic field and deflects the electron beam. The aperture 24 has an aperture hole through which the electron beam passes. In a state where the electrostatic deflector 22 does not deflect the electron beam, the electron beam passes through the aperture hole. Therefore, the electron beam irradiates the specimen 2. By having the electrostatic deflector 22 deflect the electron beam, the electron beam is blocked by the aperture 24. Therefore, the electron beam does not irradiate the specimen 2.

Since the blanking device 20 deflects the electron beam with the electrostatic deflector 22, the electron beam can be deflected at a higher speed than in a case where the electron beam is deflected by a magnetic coil. For example, the electrostatic deflector 22 can deflect the electron beam in the order of nanoseconds. Therefore, the blanking device 20 enables on and off of the electron beam to be switched at high speed.

The irradiation optical system 30 irradiates the specimen 2 with an electron beam generated from the electron source 10. The irradiation optical system 30 focuses the electron beam to form an electron probe. For example, the irradiation optical system 30 includes a condenser lens and an upstream-side magnetic field of an objective lens.

The scanning deflector 40 causes the electron beam irradiating the specimen 2 to be deflected two-dimensionally. The scanning deflector 40 deflects the electron beam based on a scanning signal generated by the scanning signal generator 72. As a result, the specimen 2 can be scanned with the electron beam (the electron probe). The scanning deflector 40 is, for example, a magnetic field coil that generates a magnetic field and deflects the electron beam.

Although not illustrated, the electron microscope 100 is equipped with a specimen stage. In a specimen chamber of the electron microscope 100, the specimen 2 is positioned by the specimen stage.

In addition, although not illustrated, the electron microscope 100 has an imaging optical system that guides electrons having been transmitted through the specimen 2 to the electron detector 50.

The electron detector 50 detects electrons having been transmitted through the specimen 2. The electron detector 50 is a dark-field STEM detector having an annular detection region. In other words, the electron detector 50 detects electrons that are inelastically scattered at high angles by the specimen 2. Detecting electrons with the electron detector 50 enables a high-angle annular dark-field scanning transmission electron microscopy image (hereinafter, also referred to as a HAADF-STEM image) to be acquired.

Alternatively, the electron detector 50 may be a bright-field STEM detector which detects electrons scattered at low angles by a transmitted wave. In addition, the electron microscope 100 may be equipped with both a bright-field STEM detector and a dark-field STEM detector.

The X-ray detector 60 detects X-rays generated from the specimen 2 when the specimen 2 is irradiated with an electron beam. The X-ray detector 60 is, for example, an energy-dispersive X-ray spectrometer (EDS detector). An X-ray spectrum can be acquired by detecting X-rays with the X-ray detector 60.

The blanking drive circuit 70 drives the blanking device 20. The scanning signal generator 72 generates a scanning signal.

The control unit 80 controls the blanking device 20. The control unit 80 includes a processor such as a CPU (Central Processing Unit) and storage devices such as a RAM (Random Access Memory) and a ROM (Read Only Memory). The storage devices store programs which allow a computer to function as the control unit 80. Functions of the control unit 80 can be realized by having the processor execute the programs. It should be noted that a part of the functions of the control unit 80 may be realized by a dedicated circuit such as an ASIC (a gate array or the like).

The input unit 90 enables the user to input information and sends the input information to the control unit 80. For example, the input unit 90 is an input device such as a button, a key, a touch panel display, or a microphone. The input unit 90 accepts input of a target value of a dose.

1.2. Operations 1.2.1. Principles

In the electron microscope 100, a dose of an electron beam with respect to the specimen 2 is controlled using the blanking device 20. The dose of an electron beam can also be described as a current amount of an electron probe.

The electrostatic deflector 22 enables on and off of the electron beam to be switched at high speed. For example, the electrostatic deflector 22 can switch between on and off of the electron beam in the order of nanoseconds. Therefore, by operating the electrostatic deflector 22, the dose of the electron beam can be controlled.

Figure 2:
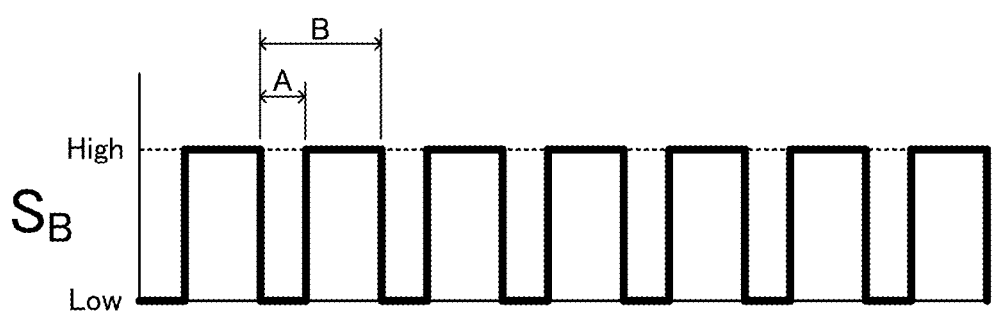
FIG. 2 is a diagram illustrating a blanking signal.
Figure 3:
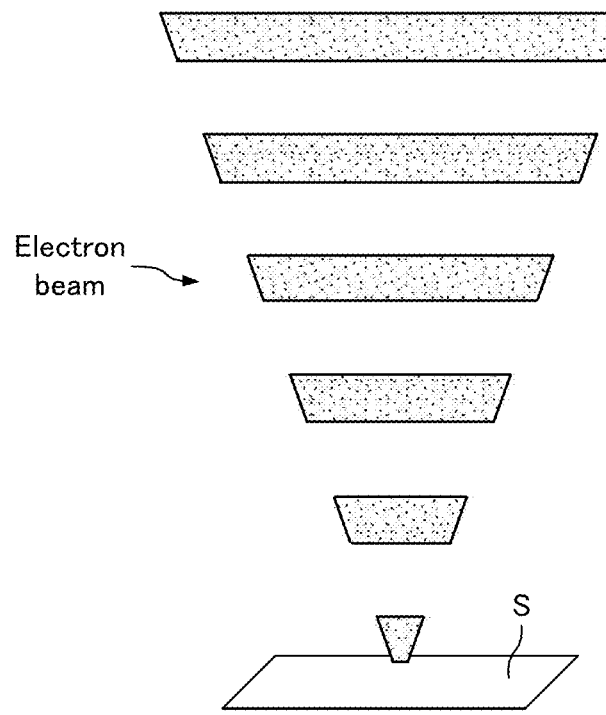
FIG. 3 is a diagram schematically illustrating an electron beam that irradiates a specimen when an electrostatic deflector is operated based on the blanking signal.

FIG. 2 is a diagram illustrating a blanking signal $S_B$ for controlling the electrostatic deflector 22. FIG. 3 is a diagram schematically illustrating an electron beam that irradiates the specimen 2 when the electrostatic deflector 22 is operated by the blanking signal $S_B$ illustrated in FIG. 2.

The electrostatic deflector 22 does not deflect the electron beam when the blanking signal $S_B$ is at a Low level. As a result, the electron beam is switched ON. The electrostatic deflector 22 deflects the electron beam when the blanking signal $S_B$ is at a High level. As a result, the electron beam is blocked and switched OFF. The blanking signal $S_B$ is a signal of which a High level and a Low level are repeated at regular intervals.

A unit time B illustrated in FIG. 2 represents an interval of the blanking signal $S_B$. In addition, a time A during which the electron beam is not blocked by the electrostatic deflector 22 is a time during which the electrostatic deflector is switched ON. A time during which the electron beam is blocked by the electrostatic deflector 22 is represented by B-A.

A dose of the electron beam can be controlled by changing a ratio A/B of the time A during which the electron beam is not blocked by the electrostatic deflector 22 to the unit time B (where A≠B, A≠0).

Figure 4:
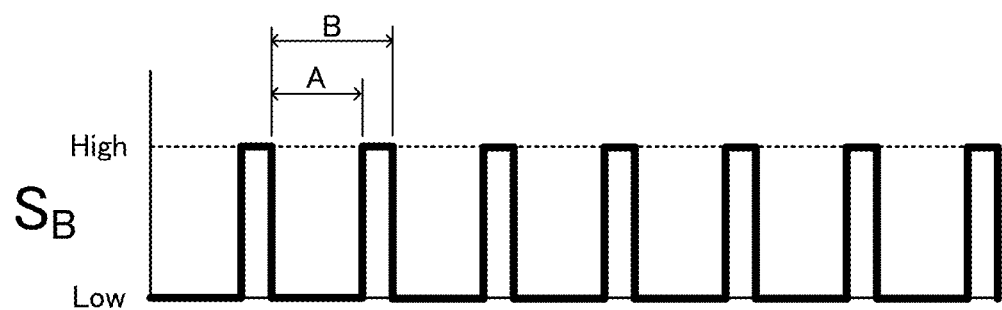
FIG. 4 is a diagram illustrating a blanking signal.
Figure 5:
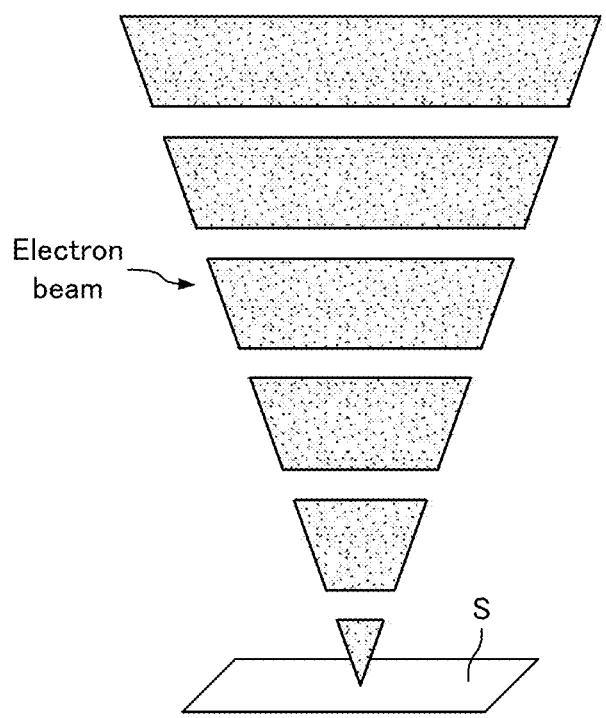
FIG. 5 is a diagram schematically illustrating an electron beam that irradiates a specimen when an electrostatic deflector is operated based on the blanking signal.

FIG. 4 is a diagram illustrating the blanking signal $S_B$ for controlling the electrostatic deflector 22. FIG. 5 is a diagram schematically illustrating an electron beam that irradiates the specimen 2 when the electrostatic deflector 22 is operated by the blanking signal $S_B$ illustrated in FIG. 4. It should be noted that the ratio A/B in the blanking signal $S_B$ illustrated in FIG. 4 is larger than the ratio A/B in the blanking signal $S_B$ illustrated in FIG. 2.

As illustrated in FIGS. 2 to 5, the dose of the electron beam can be controlled by changing the ratio A/B. Specifically, the larger the ratio A/B, the larger the dose of the electron beam.

In this case, the unit time B is set equal to or shorter than a dwell time $T_{pixel}$ of the electron beam per pixel of a scanned image (B≤$T_{pixel}$). Accordingly, in a scanned image, an effect of switching the electron beam on and off can be reduced. Generally, the dwell time $T_{pixel}$ of the electron beam per pixel of a STEM image is in the order of microseconds. Therefore, B≤$T_{pixel}$ can be realized by using the electrostatic deflector 22 capable of operating in the order of nanoseconds.

Figure 6:
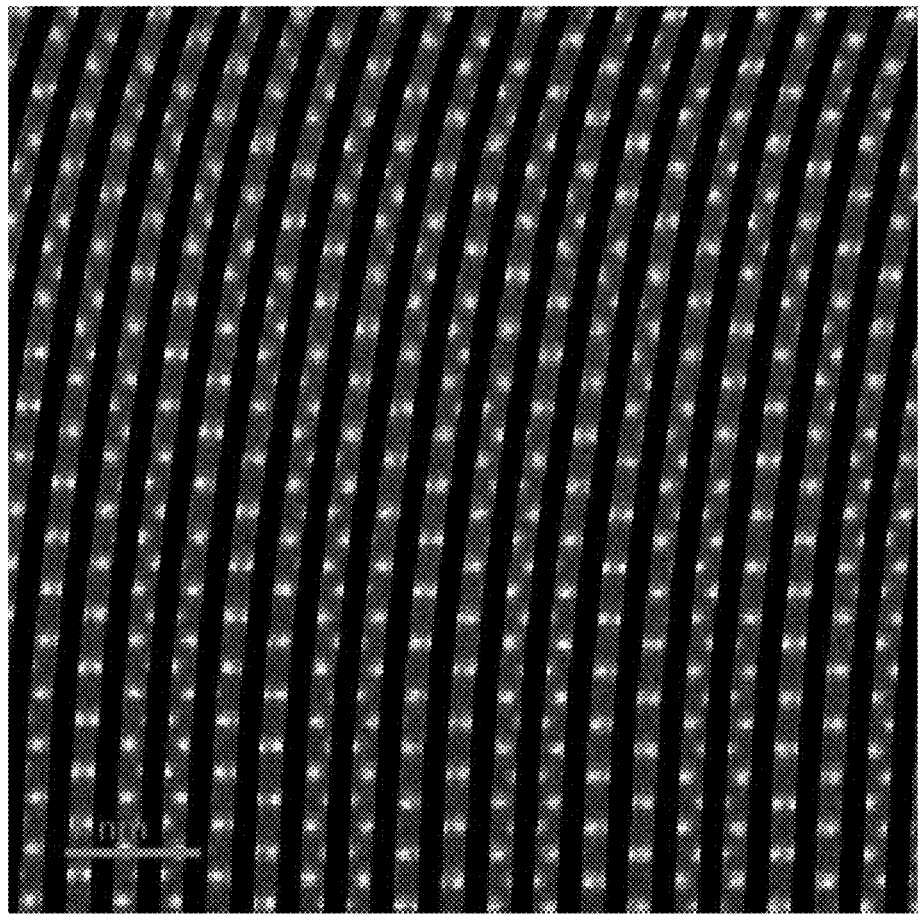
FIG. 6 is an HAADF-STEM image of silicon.
Figure 7:
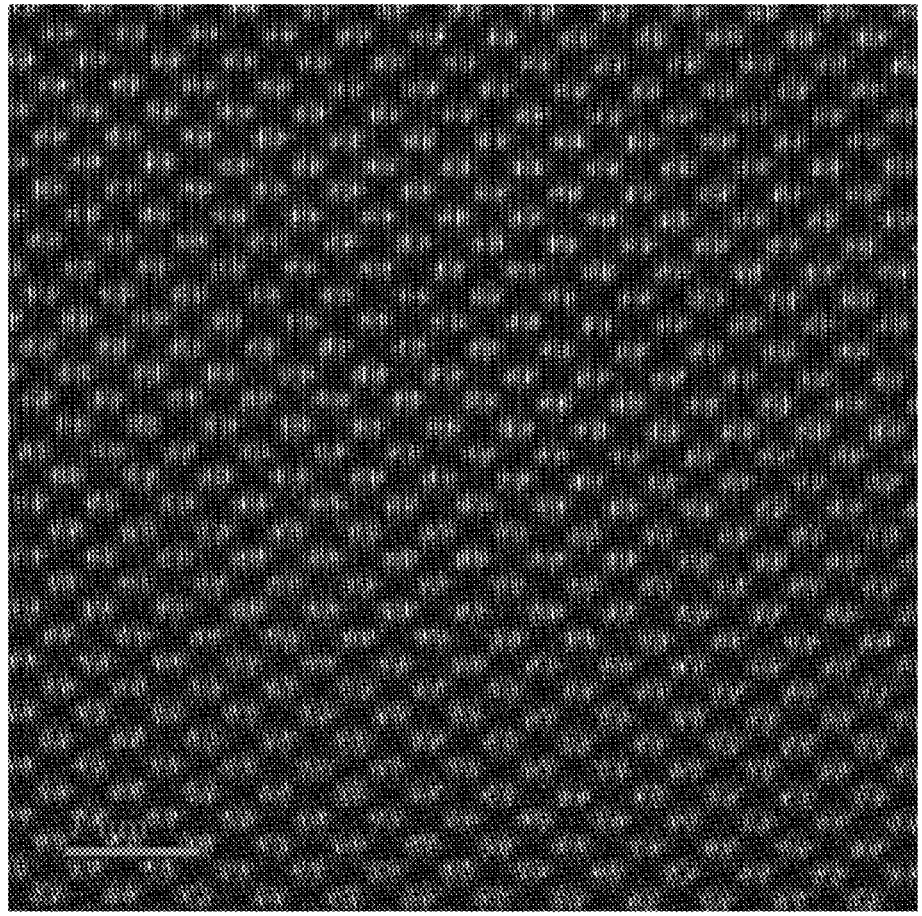
FIG. 7 is an HAADF-STEM image of silicon.
Figure 8:
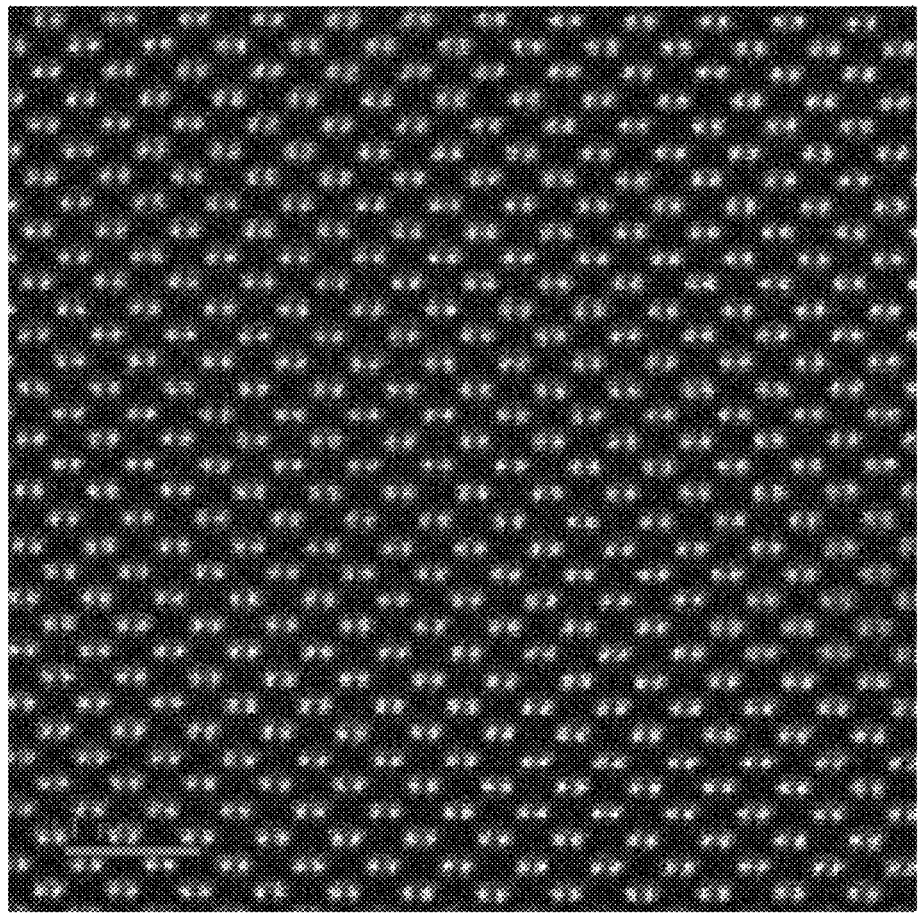
FIG. 8 is an HAADF-STEM image of silicon.

FIGS. 6 to 8 represent HAADF-STEM images of silicon [110].

FIG. 6 represents a HAADF-STEM image when the electrostatic deflector 22 is operated while setting the unit time B to 1 millisecond and the time A during which the electron beam is switched on to 0.5 milliseconds. In other words, FIG. 6 represents a HAADF-STEM image when the electrostatic deflector 22 is operated at 1 KHz.

FIG. 7 represents a HAADF-STEM image when the electrostatic deflector 22 is operated while setting the unit time B to 0.1 millisecond and the time A during which the electron beam is switched on to 50 microseconds. In other words, FIG. 7 represents a HAADF-STEM image when the electrostatic deflector 22 is operated at 10 KHz.

FIG. 8 represents a HAADF-STEM image when the electrostatic deflector 22 is operated while setting the unit time B to 10 microseconds and the time A during which the electron beam is switched on to 5 microseconds. In other words, FIG. 8 represents a HAADF-STEM image when the electrostatic deflector 22 is operated at 100 KHz. It should be noted that the ratio A/B is ½ (50%) in the HAADF-STEM images illustrated in FIGS. 6 to 8. In addition, the dwell time $T_{pixel}$ per pixel of the HAADF-STEM images illustrated in FIGS. 6 to 8 is 38 microseconds.

The unit times B when the HAADF-STEM image illustrated in FIG. 6 and the HAADF-STEM image illustrated in FIG. 7 had been photographed are longer than the dwell time $T_{pixel}$. Therefore, a plurality of stripes caused by switching the electron beam on and off can be confirmed in the HAADF-STEM image illustrated in FIG. 6 and the HAADF-STEM image illustrated in FIG. 7.

The unit time B when the HAADF-STEM image in FIG. 8 had been photographed is shorter than the dwell time $T_{pixel}$. Therefore, stripes caused by switching the electron beam on and off are not visible in the HAADF-STEM image illustrated in FIG. 8. In this manner, by setting the unit time B equal to or shorter than the dwell time $T_{pixel}$, an effect of switching the electron beam on and off in a scanned image can be reduced.

Figure 9:
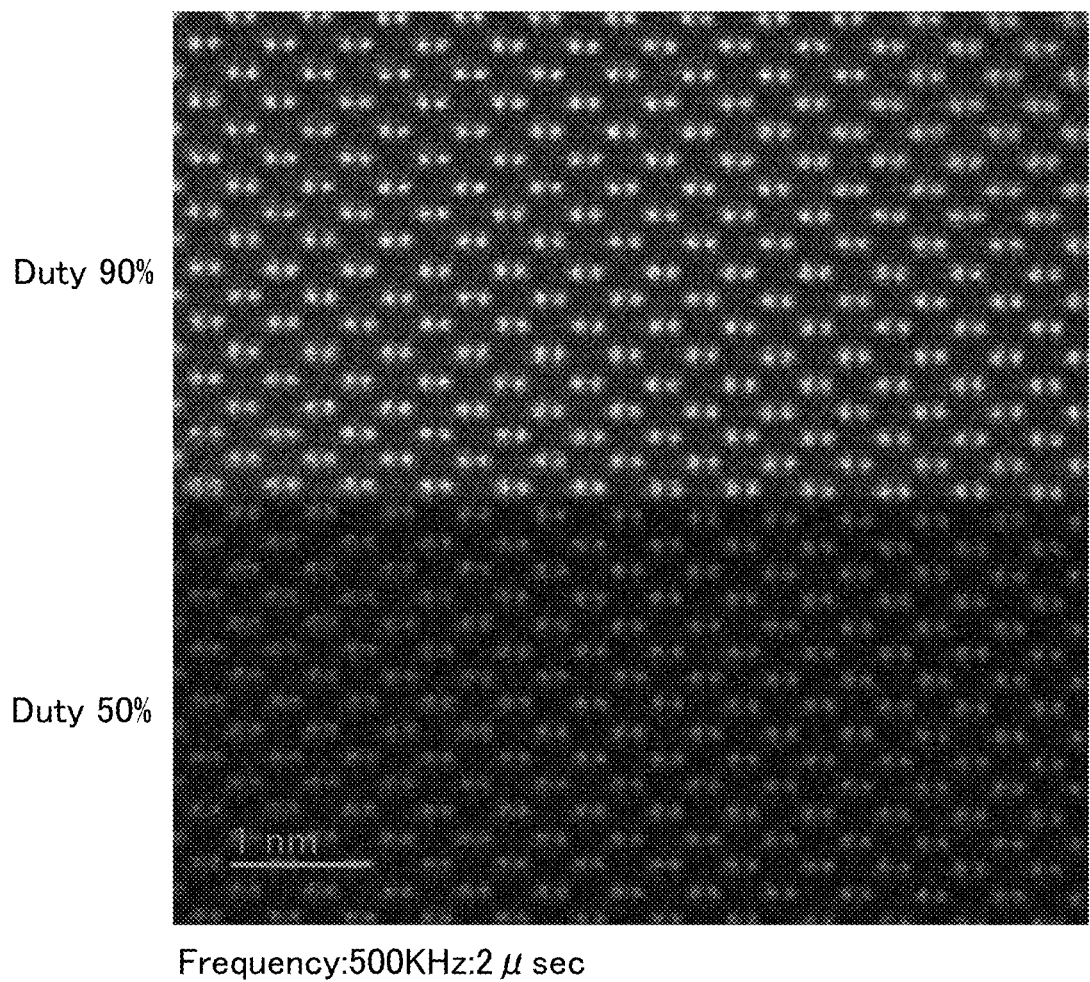
FIG. 9 is an HAADF-STEM image of silicon.

FIG. 9 represents a HAADF-STEM image of silicon [110]. In FIG. 9, the electrostatic deflector 22 is operated while setting the ratio A/B to 9/10 (90%) in a former half portion of the HAADF-STEM image but the electrostatic deflector 22 is operated while setting the ratio A/B to ½ (50%) in a latter half portion of the HAADF-STEM image. The unit time B is set to 2 microseconds and the dwell time $T_{pixel}$ per pixel is set to 19 microseconds.

As illustrated in FIG. 9, in the former half portion of the HAADF-STEM image, a brighter image is obtained than in the latter half portion of the HAADF-STEM image. In this manner, the dose of the electron beam can be increased by increasing the ratio A/B.

Figure 10:
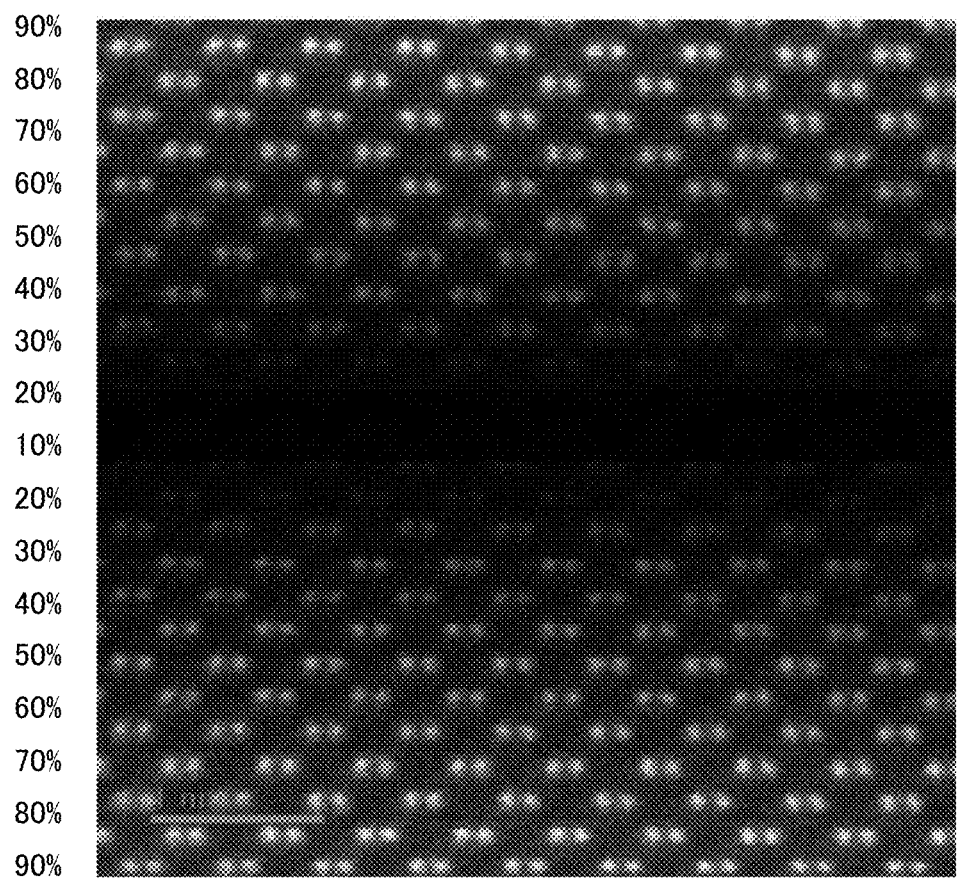
FIG. 10 is an HAADF-STEM image of silicon.

FIG. 10 represents a HAADF-STEM image of silicon [110]. In FIG. 10, the electrostatic deflector 22 is operated while changing the ratio A/B. In FIG. 10, the ratio A/B is reduced from 90% to 10% and subsequently increased from 10% to 90%.

By controlling the dose with the blanking device 20, the dose of the electron beam can be accurately changed at high speed as illustrated in FIG. 10.

1.2.2. Operations

In the electron microscope 100, when the user designates a dose of an electron beam, the control unit 80 operates the blanking device 20 so that the designated dose is produced.

Figure 11:
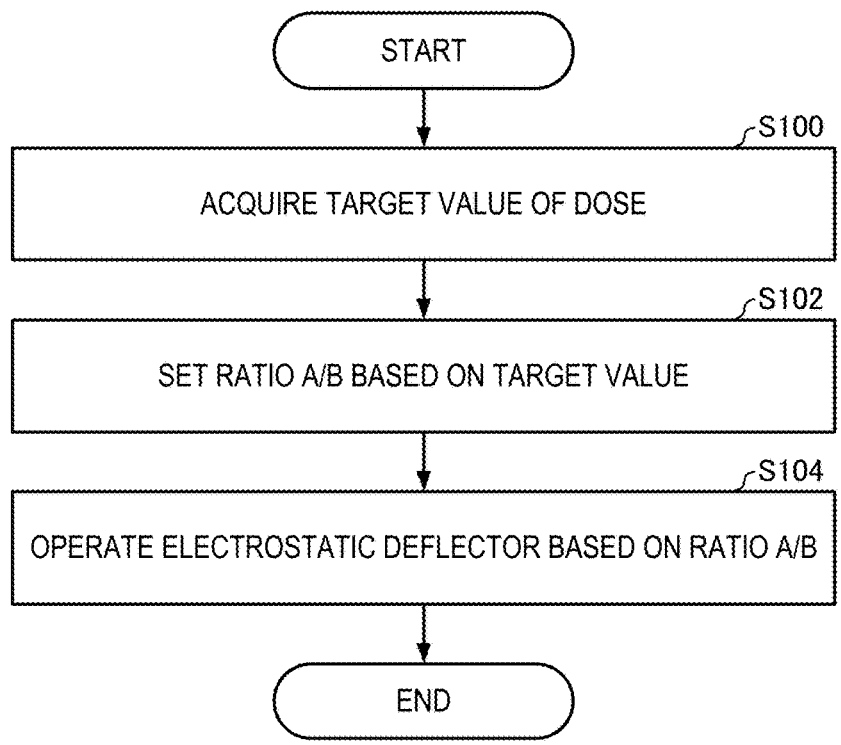
FIG. 11 is a flow chart illustrating an example of processing performed by a control unit.

FIG. 11 is a flow chart illustrating an example of processing performed by the control unit 80.

First, the control unit 80 acquires a target value of the dose of the electron beam (S100). For example, when the user inputs the target value via the input unit 90, the input unit 90 sends the target value to the control unit 80. Accordingly, the control unit 80 acquires the target value.

The control unit 80 sets the ratio A/B based on the target value (S102). The storage device of the control unit 80 stores a table indicating a relationship between a dose of the electron beam and the ratio A/B in advance. The control unit 80 refers to the table to set a ratio A/B that causes the dose of the electron beam to equal the target value. Alternatively, the control unit 80 may set a ratio A/B that causes the dose of the electron beam to equal the target value using a mathematical expression indicating the relationship between a dose of the electron beam and the ratio A/B.

The control unit 80 operates the electrostatic deflector 22 based on the set ratio A/B (S104). The control unit 80 generates the blanking signal $S_B$ based on the set ratio A/B and sends the generated blanking signal $S_B$ to the blanking drive circuit 70. Accordingly, the electrostatic deflector 22 operates based on the blanking signal $S_B$. As a result, the dose of the electron beam can be set to the target value.

1.3. Operational Advantage

In the electron microscope 100, the control unit 80 performs: processing of acquiring a target value of a dose; processing of setting, based on the target value, a ratio A/B of a time A during which the electron beam is not blocked to a unit time B (where A≠B, A≠0); and processing of operating the electrostatic deflector 22 based on the ratio A/B. Therefore, in the electron microscope 100, the dose of the electron beam can be controlled with the blanking device 20.

For example, in a conventional electron microscope, the dose of an electron beam is adjusted by changing excitation of a condenser lens or resizing an aperture of an irradiation optical system. However, a change in the excitation of the condenser lens necessitates axis alignment and an adjustment of an aberration corrector. In addition, resizing of the aperture necessitates an adjustment of the aperture. Furthermore, resizing of the aperture causes a convergence angle of the electron beam to change.

By comparison, in the electron microscope 100, since the dose of the electron beam can be controlled with the blanking device 20, such problems do not occur. In other words, in the electron microscope 100, the dose of the electron beam can be changed without changing conditions of the optical system. Therefore, with the electron microscope 100, the dose of the electron beam can be changed at high speed. As a result, for example, as illustrated in FIGS. 9 and 10, the dose of the electron beam can be changed while acquiring a single scanned image.

In a case where the electron beam is deflected using a magnetic coil in the blanking device 20, an effect of magnetic hysteresis makes it difficult to accurately control the dose. In the electron microscope 100, since the electron beam is deflected by the electrostatic deflector 22, the dose can be accurately controlled.

In this manner, in the electron microscope 100, the dose of the electron beam can be accurately controlled at high speed.

In the electron microscope 100, the unit time B is set equal to or shorter than a dwell time $T_{pixel}$ of the electron beam per pixel of a scanned image. Accordingly, in the electron microscope 100, an effect of switching the electron beam on and off can be reduced in a scanned image.

The electron microscope 100 includes the input unit 90 that accepts input of a target value. Therefore, with the electron microscope 100, a scanned image can be obtained at a dose desired by the user.

1.4. Modification

1.4.1. First Modification

Figure 12:
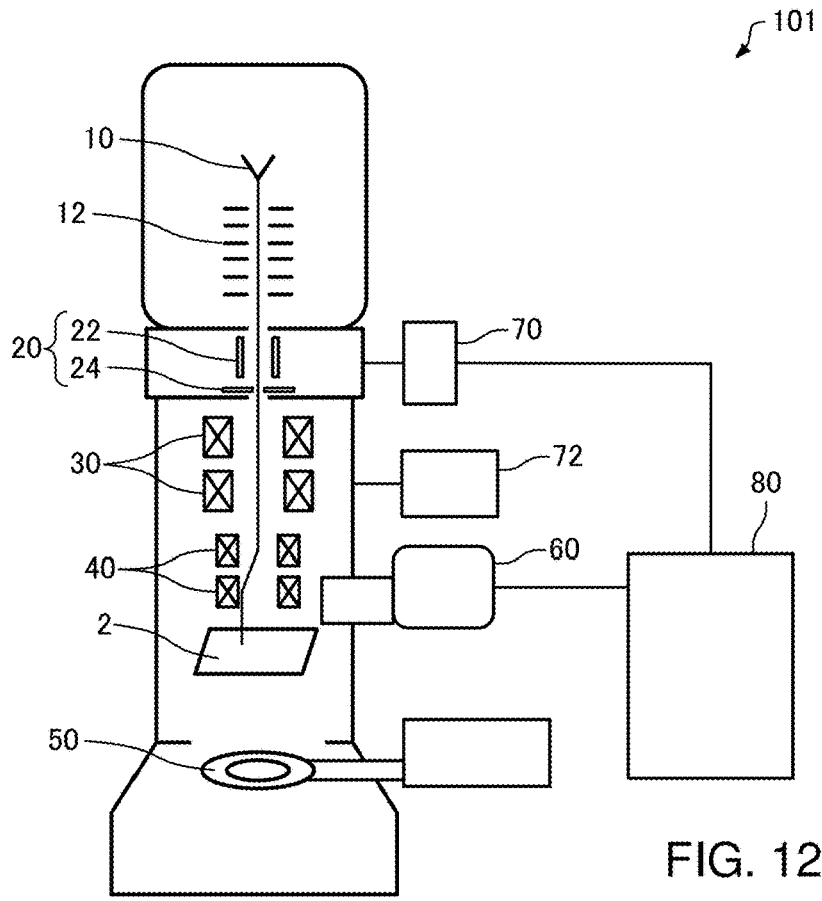
FIG. 12 is a diagram illustrating a configuration of an electron microscope according to the first modification.

FIG. 12 is a diagram illustrating a configuration of an electron microscope 101 according to the first modification. Hereinafter, in the electron microscope 101 according to the first modification, members having similar functions to the components of the electron microscope 100 described above will be denoted by same reference characters and a detailed description thereof will be omitted.

In the electron microscope 100, the control unit 80 acquires a target value of a dose when the input unit 90 accepts an input of the target value and sends the target value to the control unit 80.

By comparison, in the electron microscope 101, the control unit 80 acquires a target value by determining the target value based on intensity of an X-ray detected by the X-ray detector 60.

The electron microscope 101 enables spectrum mapping to be performed. In spectrum mapping, a spectrum is acquired for each pixel while two-dimensionally scanning the specimen 2 with an electron beam. Accordingly, data that associates a position on the specimen 2 with a spectrum can be obtained.

In the electron microscope 101, an X-ray spectrum is acquired per pixel by detecting X-rays with the X-ray detector 60 while scanning the specimen 2 with the electron beam. Accordingly, an X-ray spectrum can be acquired for each pixel of a map. For example, the control unit 80 generates an elemental map by extracting an intensity of an X-ray unique to each element from the X-ray spectrum obtained per pixel.

Figure 13:
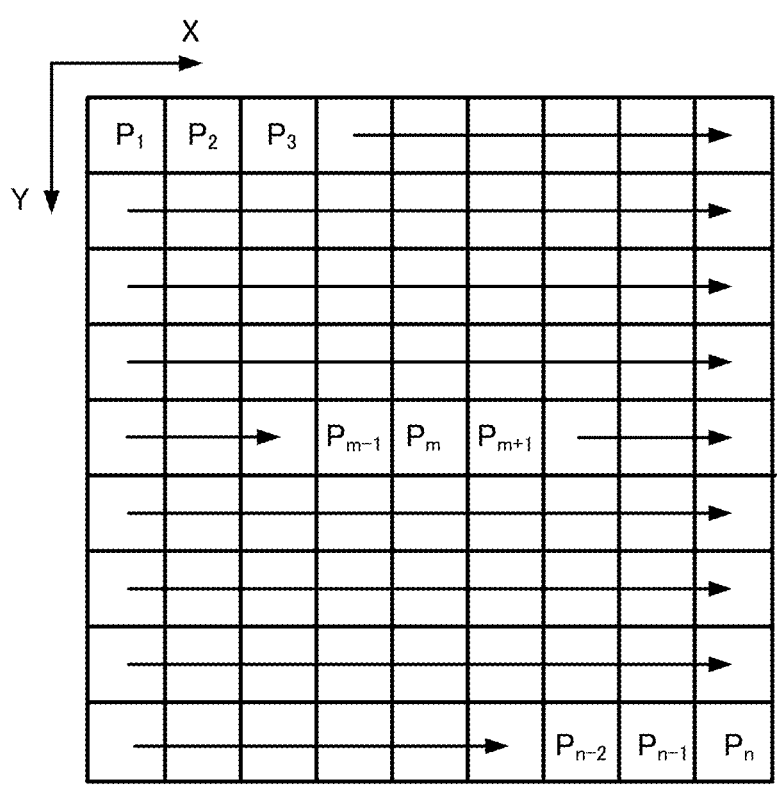
FIG. 13 is a diagram for illustrating a method of acquiring a scanned image.

FIG. 13 is a diagram for explaining scanning with an electron beam.

Scanning with the electron beam is performed by drawing a scan line by linearly moving the electron beam in a +X direction and then moving the scan line in a +Y direction. As a result, X-ray spectra from a pixel $P_1$ to a pixel $P_n$ can be acquired. At this point, a dose of the electron beam of an arbitrary pixel $P_m$ is determined based on X-ray intensity in an immediately preceding pixel $P_{m-1}$. It should be noted that a scanned image is made up of n-number of pixels, where $1 \leq m \leq n$.

In this case, when focusing on an element E, the target value of the dose is determined so that the X-ray intensity of the element E in the pixel $P_{m-1}$ is a constant intensity. For example, the target value of the dose can be determined from the X-ray intensity using a table indicating a relationship between the X-ray intensity and the dose or a mathematical expression indicating a relationship between the X-ray intensity and the dose.

It should be noted that the determination method of the target value is not limited to the example described above. For example, the target value in the pixel $P_m$ can be determined based on an SN ratio of the X-ray spectrum in the immediately preceding pixel $P_{m-1}$. In addition, for example, when focusing on a compound of an element E1 and an element E2, the target value in the pixel $P_m$ can be determined based on a ratio of the X-ray intensity of the element E1 to the X-ray intensity of the element E2 in the immediately preceding pixel $P_{m-1}$. Accordingly, information on a distribution of the compound of the element E1 and the element E2 can be obtained.

As described above, by determining a target value based on the X-ray intensity and controlling the dose of the electron beam, a preferable spectrum map can be obtained. In addition, by determining a target value based on the X-ray intensity and controlling the dose of the electron beam, a scanned image other than a spectrum map (a bright-field STEM image, a dark-field STEM image, or the like) may be acquired.

Figure 14:
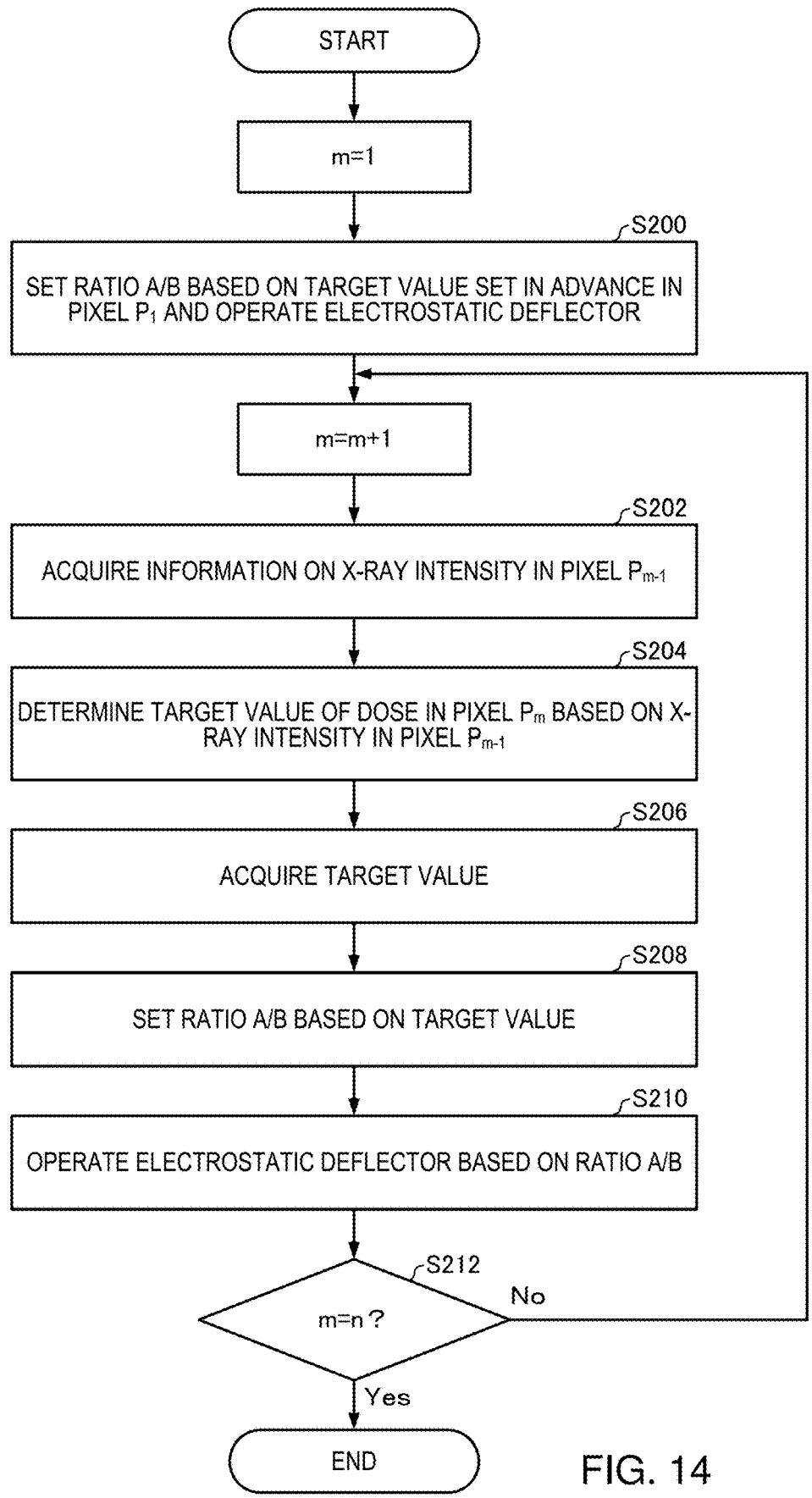
FIG. 14 is a flow chart illustrating an example of processing performed by a control unit.

FIG. 14 is a flow chart illustrating an example of processing performed by the control unit 80 of the electron microscope 101.

First, in the pixel $P_1$, the control unit 80 sets the ratio A/B based on the target value of the dose set in advance and operates the electrostatic deflector 22 (S200). As a result, the dose of the electron beam in the pixel $P_1$ equals the target value set in advance.

The control unit 80 acquires information on the X-ray intensity in the pixel $P_1$(S202). An X-ray generated when a region corresponding to the pixel $P_1$ is irradiated with the electron beam is detected by the X-ray detector 60. Information on the X-ray intensity in the pixel $P_1$ is output from the X-ray detector 60.

The control unit 80 determines the target value in the pixel $P_2$ based on the X-ray intensity in the pixel $P_1$(S204). A method of determining the target value is as described above.

The control unit 80 acquires the determined target value (S206) and sets the ratio A/B based on the target value (S208). In addition, the control unit 80 operates the electrostatic deflector 22 based on the set ratio A/B (S210). As a result, the dose of the electron beam in the pixel $P_2$ equals the target value determined in the processing step S204.

The processing step S206, the processing step S208, and the processing step S210 described above are performed in a similar manner to the processing step S100, the processing step S102, and the processing step S104 illustrated in FIG. 11.

The control unit 80 determines whether or not processing with respect to the pixel $P_1$ has been performed (S212), and when it is determined that processing with respect to the pixel $P_1$ has not been performed (No in S212), the control unit 80 returns to the processing step S202 and acquires information on the X-ray intensity in the pixel $P_2$ (S202). In addition, the control unit 80 performs the processing step S204, the processing step S206, the processing step S208, and the processing step S210 to control the dose of the electron beam in the pixel $P_3$.

For example, in an arbitrary pixel $P_m$, the control unit 80 acquires information on the X-ray intensity at a pixel $P_{m-1}$ (S202), and determines the target value in the pixel $P_m$ based on the X-ray intensity in the pixel $P_{m-1}$ (S204). The control unit 80 acquires the determined target value (S206) and sets the ratio A/B based on the target value (S208). In addition, the control unit 80 operates the electrostatic deflector 22 based on the set ratio A/B (S210).

The control unit 80 repeats the processing step S202, the processing step S204, the processing step S206, the processing step S208, the processing step S210, and the processing step S212 until processing is performed with respect to the pixel $P_1$.

When the control unit 80 determines that processing with respect to the pixel $P_1$ has been performed (Yes in S212), the control unit 80 ends the processing.

The electron microscope 101 includes the X-ray detector 60 that detects an X-ray generated from the specimen 2 when the specimen 2 is irradiated with an electron beam, and the control unit 80 determines a target value based on the X-ray intensity. Therefore, with the electron microscope 101, preferable data can be obtained over an entire region of a map. In addition, with the electron microscope 101, damage to the specimen 2 caused by irradiation of the electron beam can be reduced.

For example, when the dose of the electron beam in a region corresponding to each pixel is constant over the entire region of a map, there end up being pixels with low X-ray intensity and of which a preferable X-ray spectrum is not obtained and regions with high X-ray intensity and of which a preferable X-ray spectrum is obtained. In addition, increasing the dose of the electron beam in order to obtain preferable X-ray spectra over the entire region of the map ends up damaging the specimen 2.

By comparison, with the electron microscope 101, since the target value is determined based on the X-ray intensity, such problems do not occur.

While the target value in the pixel $P_m$ is determined in this case based on the X-ray intensity in the immediately preceding pixel $P_{m-1}$, as long as the X-ray intensity in the pixel $P_m$ can be estimated, a pixel on which the estimation is based need not be limited to the immediately preceding pixel $P_{m-1}$.

For example, a first scan may be performed with respect to the specimen 2 by setting a constant dose of the electron beam, and the target value of a pixel $P_m$ in a second scan may be determined based on the X-ray intensity in the pixel $P_m$ in the first scan. In other words, the target value of the pixel $P_m$ in an X-th scan may be determined based on the X-ray intensity in the pixel $P_m$ in an X−1-th scan.

Alternatively, for example, the X-ray intensity per unit time may be monitored, and the dose of the electron beam can be adjusted in real time by determining the target value based on the X-ray intensity per unit time.

In addition, while a case where the target value is determined based on the X-ray intensity detected by the X-ray detector 60 has been described above, the target value may be determined based on a signal intensity detected by other detectors. For example, the target value may be determined based on an intensity of electrons (a peak intensity of an EELS spectrum) detected by an electron energy-loss spectrometer (EELS). In addition, for example, the target value may be determined based on an intensity of electrons having been transmitted through the specimen 2 detected by the electron detector 50. For example, brightness of a STEM image may be used as an intensity of electrons.

It should be noted that, when the electron microscope 100 functions as a scanning electron microscope, the target value may be determined based on an intensity of secondary electrons detected by a secondary electron detector or an intensity of backscattered electrons detected by a backscattered electron detector.

1.4.2. Second Modification

Figure 15:
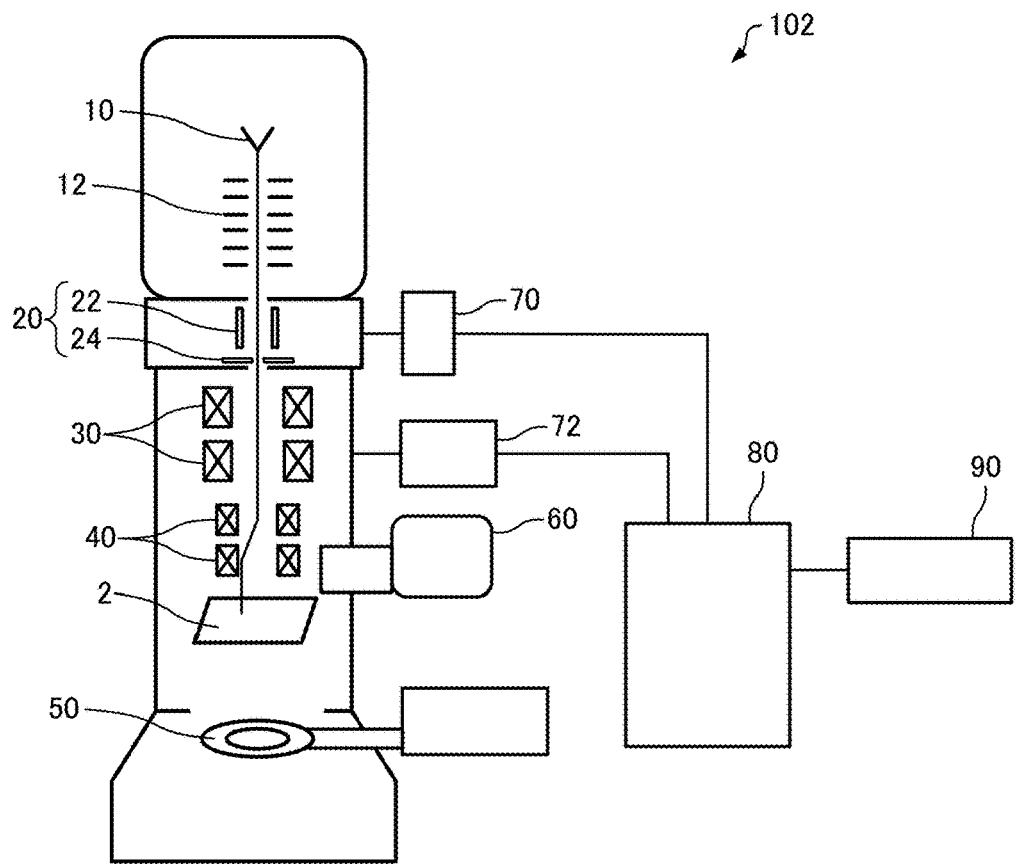
FIG. 15 is a diagram illustrating a configuration of an electron microscope according to the second modification.

FIG. 15 is a diagram illustrating a configuration of an electron microscope 102 according to the second modification. Hereinafter, in the electron microscope 102 according to the second modification, members having similar functions to the components of the electron microscope 100 described above will be denoted by same reference characters and a detailed description thereof will be omitted.

In the electron microscope 102, an electron beam is blocked during a swing-back time of the electron beam or, in other words, a flyback time when scanning with the electron beam and acquiring a scanned image.

Figure 16:
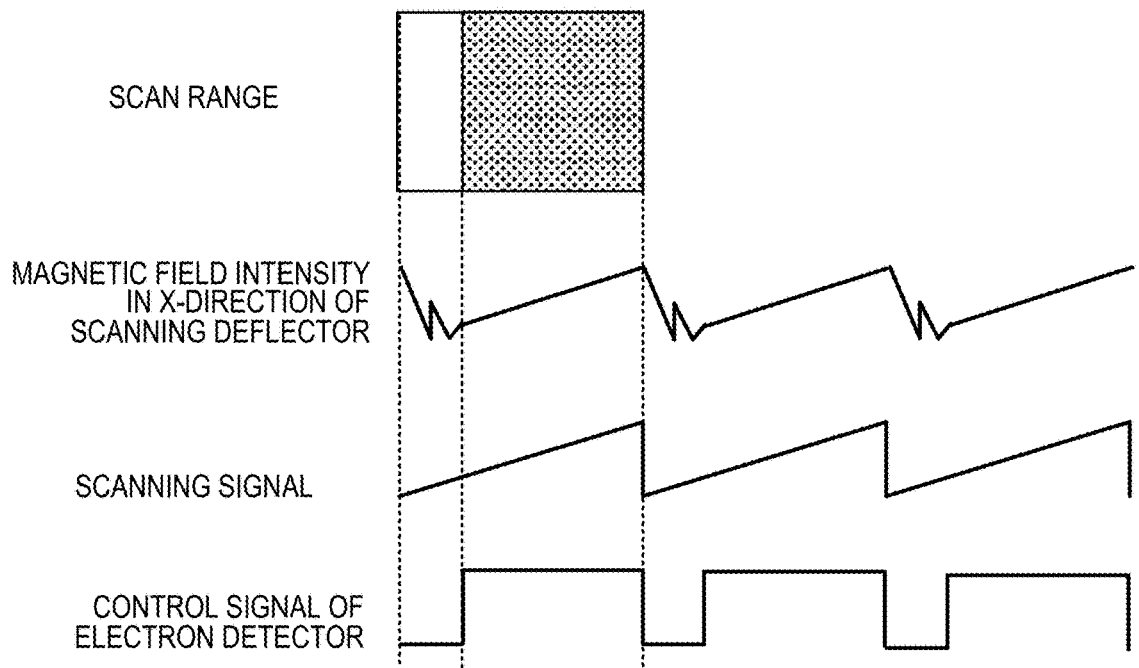
FIG. 16 is a diagram for explaining operations of the electron microscope according to the second modification.

FIG. 16 is a diagram for explaining operations of the electron microscope 102. FIG. 16 is a diagram illustrating an intensity of a magnetic field in the X-direction that is generated by the scanning deflector 40, a scanning signal for performing a scan in the X-direction with the electron beam, and a control signal for controlling the electron detector 50.

When acquiring a scanned image, as illustrated in FIG. 13 described earlier, the specimen 2 is scanned with the electron beam by drawing a scan line by linearly moving the electron beam in a +X direction and then moving the scan line in a +Y direction. After drawing the scan line, the electron beam having been moved in the +X direction is swung back in a −X direction to a large extent in order to draw a next scan line. This is referred to as a flyback.

When the electron beam is moved to a large extent in this manner or, in other words, when the electron beam is deflected to a large extent by the scanning deflector 40, ringing occurs as illustrated in FIG. 16. This is attributable to responsiveness of the magnetic field coil that is used as the scanning deflector 40.

The scanning signal generator 72 generates a control signal for controlling the electron detector 50 together with a scanning signal. The control signal is a signal that controls on and off of the electron detector 50. The electron detector 50 detects electrons when the control signal is at a High level and stops detecting electrons when the control signal is at a Low level. The control signal is at a Low level during a flyback time or, in other words, during a period in which ringing has occurred and at a High level during a period in which the electron beam linearly moves. Therefore, the detection of electrons is stopped during a flyback time but electrons are detected during a period in which the electron beam linearly moves and an image is acquired.

Figure 17:
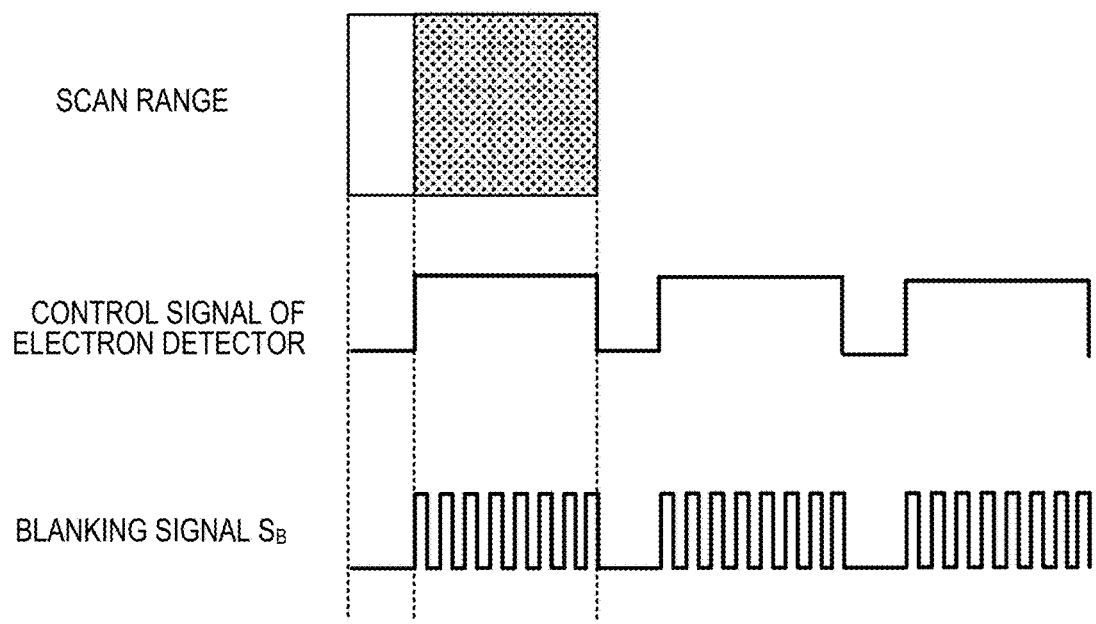
FIG. 17 is a diagram illustrating a blanking signal.

FIG. 17 is a diagram illustrating the blanking signal $S_B$ for controlling the electrostatic deflector 22.

The control unit 80 generates the blanking signal $S_B$ for controlling the electrostatic deflector 22 illustrated in FIG. 17. The control unit 80 links the blanking signal $S_B$ with the control signal for controlling the electron detector 50. Specifically, the control unit 80 outputs a Low-level signal when the control signal is at a Low level. In addition, the control unit 80 outputs a signal in accordance with the ratio A/B illustrated in FIG. 2 described earlier when the control signal is at a High level.

By the operation of the electrostatic deflector 22 based on the blanking signal $S_B$ illustrated in FIG. 17, the electron beam during the flyback is cut off. In addition, during image acquisition, an electron beam of a dose corresponding to the target value irradiates the specimen 2.

The electron microscope 102 includes the scanning signal generator 72 which generates a scanning signal for operating the scanning deflector 40 and a control signal for controlling on and off of the electron detector 50, and the control unit 80 blocks an electron beam to the electrostatic deflector 22 during a period in which the electron detector 50 has stopped detecting electrons based on the control signal. Therefore, with the electron microscope 102, damage to the specimen caused by irradiation of the electron beam can be reduced. Furthermore, specimen contamination caused by irradiation of the electron beam can be reduced.

1.4.3. Third Modification

Figure 18:
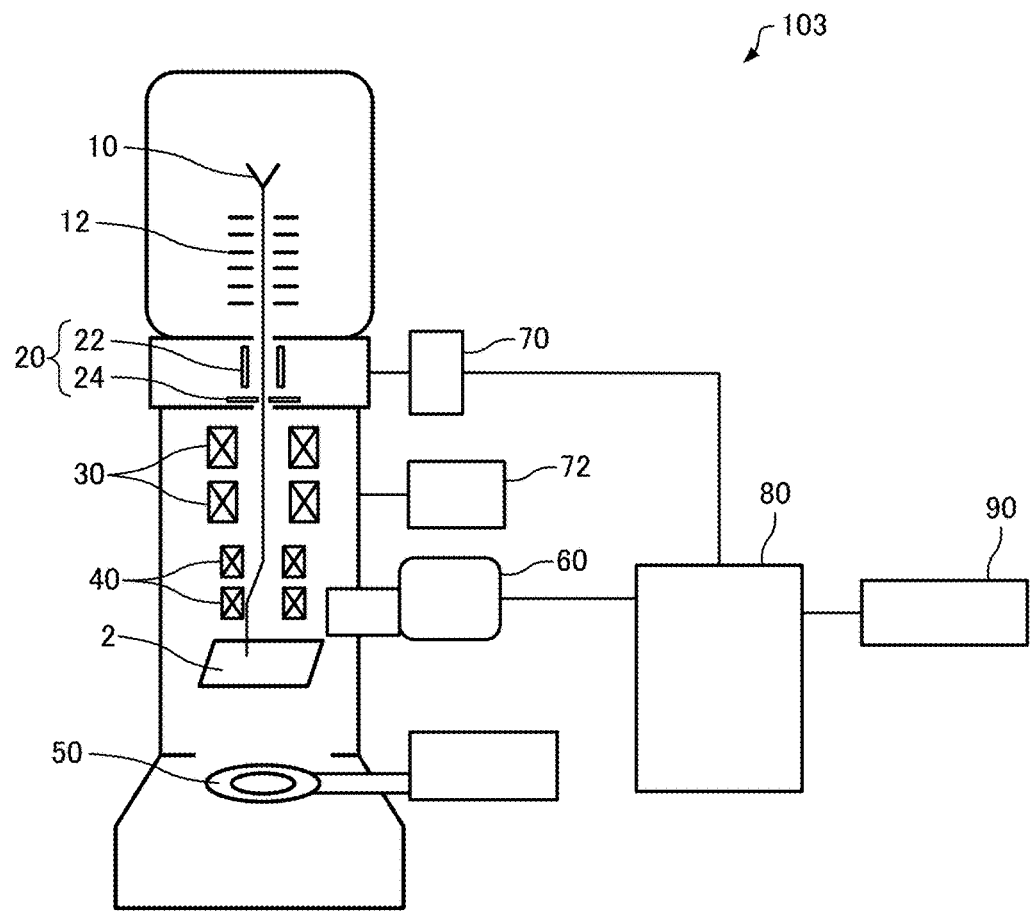
FIG. 18 is a diagram illustrating a configuration of an electron microscope according to the third modification.

FIG. 18 is a diagram illustrating a configuration of an electron microscope 103 according to the third modification. Hereinafter, in the electron microscope 103 according to the third modification, members having similar functions to the components of the electron microscope 100 described above will be denoted by same reference characters and a detailed description thereof will be omitted.

In the electron microscope 103, an electron beam is blocked during a dead time of the X-ray detector 60.

In the X-ray detector 60, time is required after detecting an X-ray in order to convert the X-ray into an electric signal. Therefore, after the detection of an X-ray, time is required until a next X-ray can be detected. The time during which an X-ray cannot be detected is referred to as a dead time. The X-ray detector 60 outputs information on the dead time in real time.

The control unit 80 accepts the information on the dead time. Based on the information on the dead time, the control unit 80 blocks the electron beam to the electrostatic deflector 22 during the dead time.

Figure 19:
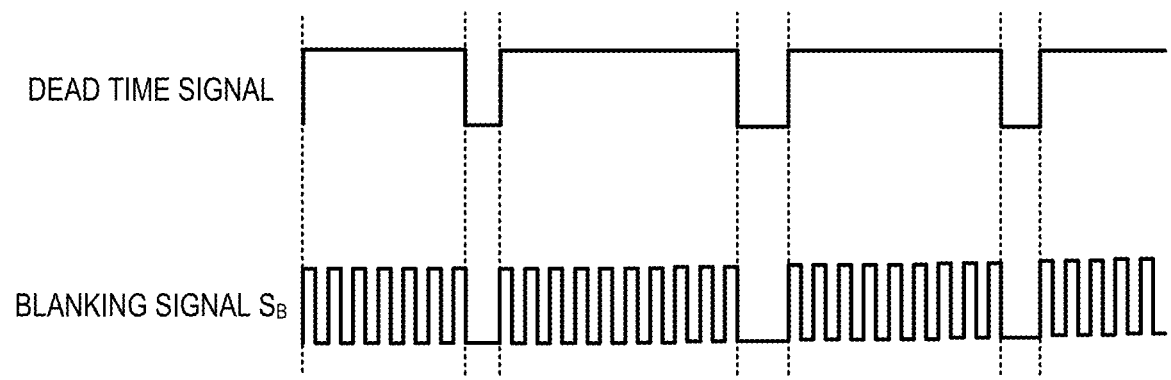
FIG. 19 is a diagram illustrating a dead time signal and a blanking signal.

FIG. 19 is a diagram illustrating a dead time signal and the blanking signal $S_B$.

The dead time signal is output from the X-ray detector 60. The X-ray detector 60 outputs a signal at a Low level during the dead time and outputs a signal at a High level in a state where an X-ray can be detected.

The control unit 80 accepts the dead time signal. Based on the dead time signal, the control unit 80 generates the blanking signal $S_B$. Specifically, the control unit 80 outputs a Low-level signal when the dead time signal is at a Low level. In addition, the control unit 80 outputs a signal in accordance with the ratio A/B illustrated in FIG. 2 described above when the control signal is at a High level.

By the operation of the electrostatic deflector 22 based on the blanking signal $S_B$ illustrated in FIG. 19, the electron beam is cut off during the dead time. In addition, during detection of an X-ray, an electron beam of a dose corresponding to the target value irradiates the specimen 2.

In the electron microscope 103, based on the information on the dead time, the control unit 80 blocks the electron beam to the electrostatic deflector 22 during the dead time. Therefore, with the electron microscope 103, damage to the specimen 2 caused by irradiation of the electron beam can be reduced. Furthermore, specimen contamination caused by irradiation of the electron beam can be reduced.

2. Second Embodiment

2.1. Electron Microscope

Figure 20:
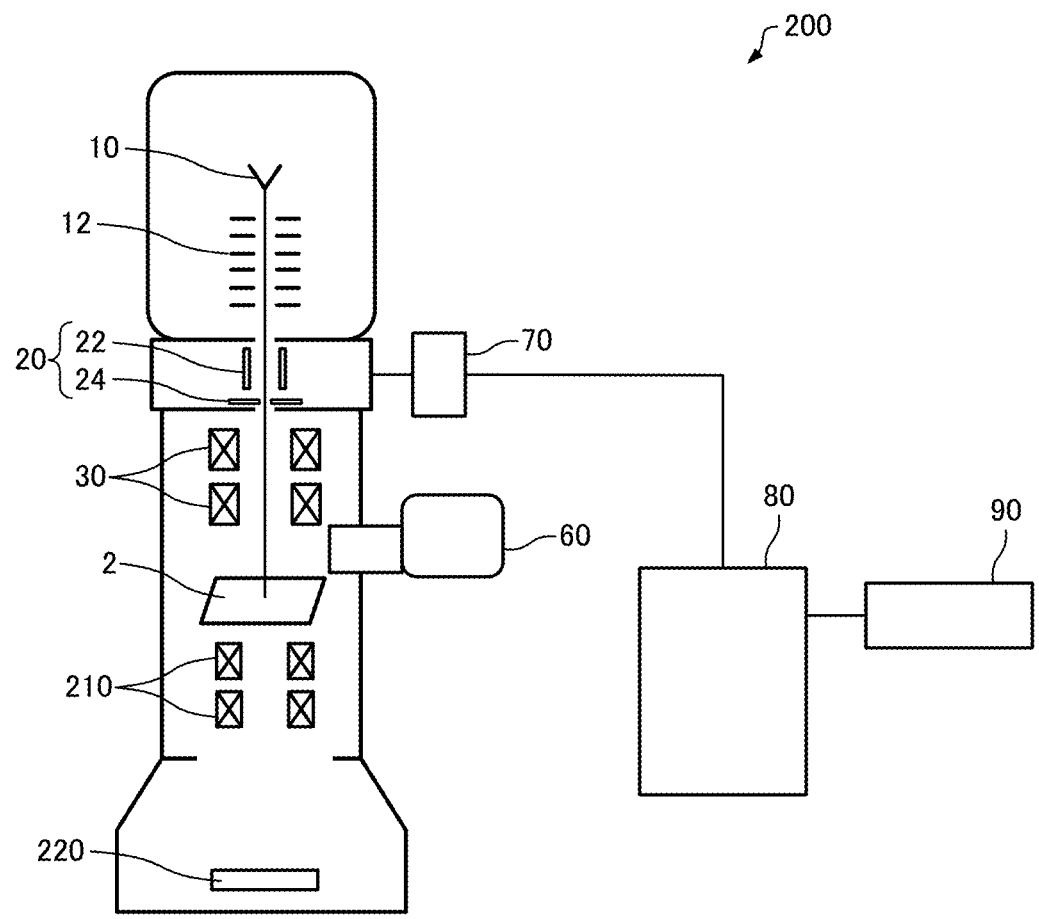
FIG. 20 is a diagram illustrating a configuration of an electron microscope according to the second embodiment.

Next, an electron microscope according to the second embodiment will be described with reference to the drawings. FIG. 20 is a diagram illustrating a configuration of an electron microscope 200 according to the second embodiment. Hereinafter, in the electron microscope 200 according to the second embodiment, members having similar functions to the components of the electron microscope 100 according to the first embodiment will be denoted by same reference characters and a detailed description thereof will be omitted.

The electron microscope 100 according to the first embodiment is a scanning transmission electron microscope (STEM) for scanning a specimen 2 with an electron beam and acquiring a scanned image.

By comparison, the electron microscope 200 according to the second embodiment is a transmission electron microscope (TEM) for imaging a specimen image using electrons having been transmitted through a specimen 2. The electron microscope 200 includes an imaging optical system 210 and an imaging device 220. Specimen images include a bright-field image, a dark-field image, and an electron diffraction pattern.

An irradiation optical system 30 irradiates the specimen 2 with, for example, an electron beam parallel to the specimen 2. The imaging optical system 210 forms a specimen image with an electron beam transmitted through the specimen 2. The imaging optical system 210 includes an objective lens, an intermediate lens, and a projector lens.

The imaging device 220 photographs the specimen image formed by the imaging optical system 210. The imaging device 220 is, for example, a digital camera such as a CCD camera or a CMOS camera.

2.2. Operations

2.2.1. Principles

In the electron microscope 200, a dose of an electron beam is controlled using a blanking device 20.

In the electron microscope 200, the dose of an electron beam is controlled by operating an electrostatic deflector 22 in a similar manner to the electron microscope 100. In other words, in the electron microscope 200, the dose of the electron beam is controlled by changing a ratio A/B. A unit time B is equal to or shorter than an exposure time $T_{SS}$ of a specimen image.

Figure 21:
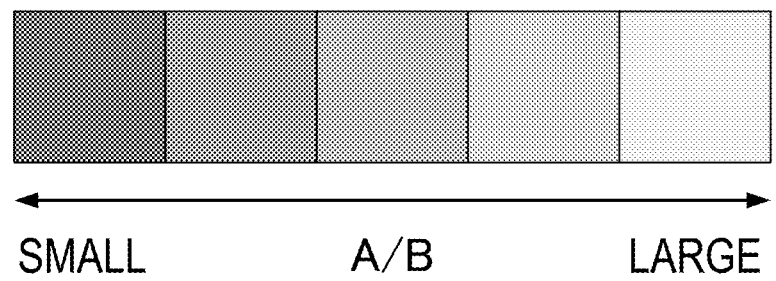
FIG. 21 is a diagram illustrating a brightness of a TEM image when a ratio A/B is changed.

FIG. 21 is a diagram illustrating a brightness of a TEM image when the ratio A/B is changed. FIG. 21 schematically illustrates screens when a TEM image is acquired by operating the electrostatic deflector 22 while changing the ratio A/B by arranging the screens in an order of magnitudes of the ratios A/B. It should be noted that each screen represents same display conditions.

As illustrated in FIG. 21, the larger the ratio A/B, the brighter the screen. In other words, the larger the ratio A/B, the larger the dose of the electron beam.

In this manner, in the electron microscope 200, the dose of the electron beam can be controlled with the blanking device 20 in a similar manner to the electron microscope 100.

2.2.2. Processing

In the electron microscope 200, when the user designates a dose, the control unit 80 operates the blanking device 20 so that the designated dose is produced. Operations of the control unit 80 in the electron microscope 200 are similar to the operations of the control unit 80 of the electron microscope 100 illustrated in FIG. 11 described above and a description thereof will be omitted.

2.3. Operational Advantage

The electron microscope 200 includes the imaging optical system 210 that forms a specimen image with an electron beam having been transmitted through the specimen 2 and the imaging device 220 that photographs a specimen image, wherein the unit time B is equal to or shorter than an exposure time $T_{SS}$ of the specimen image. Therefore, in the electron microscope 200, the dose of the electron beam can be accurately controlled at high speed in a similar manner to the electron microscope 100.

2.4. Modification

Even in the electron microscope 200, a target value of a dose may be determined based on the X-ray intensity or the like in a similar manner to the electron microscope 100 described above. In addition, in the electron microscope 200, the target value of the dose may be determined based on an intensity of electrons having been detected by the imaging device 220. For example, information on brightness of a TEM image photographed by the imaging device 220 may be acquired in real time and the target value may be determined based on the brightness.

3. Other

While a case where the charged particle beam device according to the invention is a scanning transmission electron microscope (STEM) has been described in the first embodiment above and a case where the charged particle beam device according to the invention is a transmission electron microscope (TEM) has been described in the second embodiment above, the charged particle beam device according to the invention is not limited thereto. For example, the charged particle beam device according to the invention may be a focused ion-beam device that observes a specimen or processes a specimen by irradiating the specimen with an ion beam or the like. Alternatively, for example, the charged particle beam device according to the invention may be a scanning electron microscope (SEM), an electron probe microanalyzer (EPMA), an Auger microprobe device, or the like.

It should be noted that the embodiments and the modifications described above are merely examples and the invention is not limited thereto. For example, the respective embodiments and the respective modifications may be combined as deemed appropriate.

The invention is not limited to the above-described embodiments, and various modifications can be made. For example, the invention includes configurations that are substantially the same as the configurations described in the embodiments. Substantially same configurations means configurations that are the same in function, method, and results, or configurations that are the same in objective and effects, for example. The invention also includes configurations in which non-essential elements described in the embodiments are replaced by other elements. The invention also includes configurations having the same effects as those of the configurations described in the embodiments, or configurations capable of achieving the same objectives as those of the configurations described in the embodiments. The invention further includes configurations obtained by adding known art to the configurations described in the embodiments.

Some embodiments of the invention have been described in detail above, but a person skilled in the art will readily appreciate that various modifications can be made from the embodiments without materially departing from the novel teachings and effects of the invention. Accordingly, all such modifications are assumed to be included in the scope of the invention.

What is claimed is:

1. A charged particle beam device, comprising:
   a charged particle beam source which emits a charged particle beam;
   a blanking device which has an electrostatic deflector that deflects and blocks the charged particle beam;
   an irradiation optical system which irradiates a specimen with the charged particle beam;
   an X-ray detector which detects an X-ray generated from the specimen by irradiating the specimen with the charged particle beam; and
   a control unit which controls the electrostatic deflector,
   the control unit performing processing of:
      acquiring a target value of a dose of the charged particle beam for the specimen;
      setting a ratio A/B of a time A during which the charged particle beam is not blocked to a unit time B (where A≠B, A≠0), based on the target value; and
      operating the electrostatic deflector based on the ratio,
   wherein
      the X-ray detector outputs information on a dead time required after detecting an X-ray for the X-ray detector to convert the X-ray into an electric signal before a next X-ray can be detected, and the control unit causes the electrostatic deflector to block the charged particle beam during the dead time, based on the information on the dead time.

2. The charged particle beam device according to claim 1, further comprising:
   a scanning deflector which scans the specimen with the charged particle beam; and
   a charged particle detector which detects charged particles having been transmitted through the specimen.

3. The charged particle beam device according to claim 2, wherein
   the unit time is equal to or shorter than a dwell time of the charged particle beam per pixel of a scanned image.

4. The charged particle beam device according to claim 2, further comprising:
   a scanning signal generator which generates a scanning signal for operating the scanning deflector and a control signal for controlling on and off of the charged particle detector, wherein
   the control unit causes the electrostatic deflector to block the charged particle beam during a period in which the charged particle detector has stopped detecting charged particles, based on the control signal.

5. The charged particle beam device according to claim 1, further comprising:
   an imaging optical system which forms a specimen image with charged particles having been transmitted through the specimen; and
   an imaging device which photographs the specimen image, wherein
   the unit time is equal to or shorter than an exposure time of the specimen image.

6. The charged particle beam device according to claim 1, wherein
   the control unit performs processing of determining the target value based on an intensity of the X-ray.

7. The charged particle beam device according to claim 1, further comprising:
   an input unit which accepts an input of the target value.

8. A charged particle beam device, comprising:
   a charged particle beam source which emits a charged particle beam;
   a blanking device which has an electrostatic deflector that deflects and blocks the charged particle beam;
   an irradiation optical system which irradiates a specimen with the charged particle beam; and
   a control unit which controls the electrostatic deflector,
   the control unit performing processing of:
      acquiring a target value of a dose of the charged particle beam for the specimen;
      setting a ratio A/B of a time A during which the charged particle beam is not blocked to a unit time B (where A≠B, A≠0), based on the target value; and
      operating the electrostatic deflector based on the ratio, wherein
   the control unit performs processing of determining the target value based on an intensity of charged particles having been transmitted through the specimen.

\* \* \* \* \*